United States Patent
Okada et al.

(10) Patent No.: US 10,359,448 B2
(45) Date of Patent: Jul. 23, 2019

(54) DEVICE AND METHOD FOR INSPECTING POSITION OF PROBE, AND SEMICONDUCTOR EVALUATION APPARATUS

(71) Applicant: Mitsubishi Electric Corporation, Tokyo (JP)

(72) Inventors: Akira Okada, Tokyo (JP); Takaya Noguchi, Tokyo (JP); Norihiro Takesako, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 216 days.

(21) Appl. No.: 15/375,224

(22) Filed: Dec. 12, 2016

(65) Prior Publication Data
US 2017/0299630 A1    Oct. 19, 2017

(30) Foreign Application Priority Data
Apr. 19, 2016    (JP) .................................. 2016-083377

(51) Int. Cl.
*G01R 1/067* (2006.01)
*G01D 5/14* (2006.01)

(52) U.S. Cl.
CPC ......... *G01R 1/06794* (2013.01); *G01D 5/145* (2013.01)

(58) Field of Classification Search
CPC ............................ G01R 1/06794; G01D 5/145
(Continued)

(56) References Cited

U.S. PATENT DOCUMENTS 6,906,543 B2 * 6/2005 Lou .................... G01R 1/07342
324/750.08
8,212,577 B2   7/2012 Yamada et al.
(Continued)

FOREIGN PATENT DOCUMENTS

CN    1545628 A    11/2004
CN    101285865 A   10/2008
(Continued)

OTHER PUBLICATIONS

An Office Action mailed by the State Intellectual Property Office of the People's Republic of China dated Apr. 10, 2019, which corresponds to Chinese Patent Application No. 201710258349.9 and is related to U.S. Appl. No. 15/375,224; with English translation.

*Primary Examiner* — Reena Aurora
(74) *Attorney, Agent, or Firm* — Studebaker & Brackett PC

(57) ABSTRACT

Provided is a probe position inspection device that can inspect with ease and higher precision a position of a probe included in a semiconductor evaluation apparatus. The probe includes an inspection magnetic field producing part that produces a magnetic field corresponding to a contact point with a subject semiconductor apparatus. The probe position inspection device includes: a base part having a front surface that can be contacted by the probe, and including a plurality of magnetic field sensors placed in a plane parallel to the front surface, each of the magnetic field sensors sensing the magnetic field produced by the inspection magnetic field producing part; and an output part electrically connected to the magnetic field sensors, the output part outputting, based on the magnetic field, a signal corresponding to each of the magnetic field sensors.

30 Claims, 7 Drawing Sheets

(58) Field of Classification Search
USPC .................................................... 324/207.2
See application file for complete search history.

(56) References Cited

U.S. PATENT DOCUMENTS

| | | |
|---|---|---|
| 2002/0198676 A1 | 12/2002 | Kirsch et al. |
| 2005/0049820 A1 | 3/2005 | Kirsch et al. |
| 2008/0231300 A1 | 9/2008 | Yamada et al. |
| 2010/0026331 A1* | 2/2010 | Chong ............... G01R 1/07342 |
| | | 324/754.03 |

FOREIGN PATENT DOCUMENTS

| | | |
|---|---|---|
| JP | H05-157790 A | 6/1993 |
| JP | 2001-189353 A | 7/2001 |
| JP | 2009-198407 A | 9/2009 |

* cited by examiner

DEVICE AND METHOD FOR INSPECTING POSITION OF PROBE, AND SEMICONDUCTOR EVALUATION APPARATUS

BACKGROUND OF THE INVENTION

Field of the Invention

The present invention relates to a probe position inspection device that inspects a position of a probe included in a semiconductor evaluation apparatus, to the semiconductor evaluation apparatus including the probe position inspection device, and to a method for inspecting the position of the probe, using the semiconductor evaluation apparatus.

Description of the Background Art

Semiconductor evaluation apparatuses evaluate electrical characteristics of a subject semiconductor apparatus to be evaluated that is manufactured on a semiconductor wafer or on a chip diced from the wafer. When evaluating the electrical characteristics, the semiconductor evaluation apparatuses fix a placing surface of the subject semiconductor apparatus to the surface of a chuck stage by, for example, vacuum suction. Then, the semiconductor evaluation apparatuses bring its probe in contact with an electrode placed on the surface of the subject semiconductor apparatus to transmit and receive electrical signals. When the subject semiconductor apparatus is a semiconductor apparatus with a vertical structure which passes a current in the vertical direction, namely, in an off-plane direction, there is continuity between an electrode placed on the back side of the subject semiconductor apparatus and an electrode placed on the surface of the chuck stage of the semiconductor evaluation apparatus. Since a semiconductor evaluation apparatus including probes can be electrically connected to electrodes of a subject semiconductor apparatus at a time, it can apply a high current and a high voltage to the subject semiconductor apparatus.

It is important to bring the probes of the semiconductor evaluation apparatus in contact with electrodes placed on the surface of the subject semiconductor apparatus with high alignment accuracy. When the probes are displaced from the electrodes when brought in contact with each other, for example, a desired current or voltage is not applied to the subject semiconductor apparatus, and therefore, the semiconductor evaluation apparatus cannot properly evaluate the subject semiconductor apparatus. Furthermore, when the probes are in contact with a region different from the electrodes to be originally in contact with the probes, the subject semiconductor apparatus may break.

The probes of the semiconductor evaluation apparatus are preferably shorter to prevent the misalignment between the probes and the electrodes of the subject semiconductor apparatus. However, under such a structure, a voltage applied between the subject semiconductor apparatus and a probe card of the semiconductor evaluation apparatus that supports the probes may cause discharge. Thus, it is necessary to extend the length of the probes to keep the probe card and the subject semiconductor apparatus apart at a predetermined distance or more. For the reasons above, it is important to accurately inspect and detect the positions of the probes when the subject semiconductor apparatus is evaluated.

Japanese Unexamined Patent Application Publication No. 2001-189353, Japanese Unexamined Patent Application Publication No. 2009-198407, and Japanese Unexamined Patent Application Publication No. H05-157790 (hereinafter referred to as Patent Document 1, Patent Document 2, and Patent Document 3, respectively) each disclose a semiconductor evaluation apparatus that inspects a position of a probe in advance before evaluating electrical characteristics of a subject semiconductor apparatus. A probe inspection device disclosed by Patent Document 1 brings probes in contact with a deformable body having a flat contact surface, and measures the positions of the probes by observing positions or sizes of traces of the probes made by the contact. Furthermore, Patent Document 2 discloses a needle trace transfer member that can eliminate traces of the probes, namely, needle traces as disclosed by Patent Document 1. A probe card inspection device disclosed by Patent Document 3 applies a probe, namely, a measurement needle to a transparent glass plate placed flush with an electrode plate on which an object to be evaluated is placed, and measures coordinates of a tip of the measurement needle through the transparent glass plate, using an needle-tip observing device such as a camera.

However, it takes some time for the probe inspection device disclosed by Patent Document 1 to inspect the probes due to observation of the traces of the probes and detection of the positions of the probes. Furthermore, every inspection of the probes requires restoration of the deformable body to which the traces of the probes have been transferred, which involves a cost. Furthermore, no device can be easily added to the conventional evaluation apparatuses afterward.

Although the needle trace transfer member with the needle traces according to Patent Document 2 requires less restoration time than that according to Patent Document 1, it still needs to be restored. Furthermore, since the method is not different from inspecting the positions of the needles after transferring and observing the traces of the needles, it takes some time to inspect the positions.

The probe card inspection device according to Patent Document 3 optically observes positions of the tips of the needles using the needle-tip observing device. The process of focusing on each of the needle tips is easily subjected to optical disturbance factors such as the background or light of the needle tips, variations in distance between the needle tips and the observing device, and extraneous matters present at the needle tips and within his/her field of view. Thus, the precision in inspection is unstable.

SUMMARY OF THE INVENTION

The object of the present invention is to provide a probe position inspection device that can inspect with ease and higher precision a position of a probe included in a semiconductor evaluation apparatus.

The probe position inspection device inspects a position of a probe included in a semiconductor evaluation apparatus. The probe includes an inspection magnetic field producing part that produces a magnetic field corresponding to a contact point with a subject semiconductor evaluation apparatus. The probe position inspection device includes a base part having a front surface that can be contacted by the probe, and including a plurality of magnetic field sensors placed in a plane parallel to the front surface, each of the magnetic field sensors sensing the magnetic field produced by the inspection magnetic field producing part. The probe position inspection device further includes an output part electrically connected to the magnetic field sensors, the output part outputting, based on the magnetic field, a signal corresponding to each of the magnetic field sensors.

The probe position inspection device can inspect the position of the probe without using traces of a probe. The probe position inspection device can reduce the time and cost for inspecting the position of the probe. Furthermore, the probe position inspection device does not include any image capturing means and thus does not require consideration of, for example, the disturbance factors in capturing images. Accordingly, the probe position inspection device can accurately inspect the position of the probe.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Embodiment 1 will describe a probe position inspection device, and a semiconductor evaluation apparatus including the probe position inspection device according to the present invention. Embodiment 1 exemplifies a case where a probe is brought in contact with a base part including a magnetic field sensor and the position of a contact part of the probe is inspected based on the magnitude of a magnetic field sensed by the magnetic field sensor, before evaluation of electrical characteristics of a subject semiconductor apparatus. The subject semiconductor apparatus is, for example, a semiconductor apparatus to be measured for electrical characteristics, which will be described later. Examples of the apparatus include a semiconductor chip and a semiconductor wafer on which semiconductor chips are arranged.

Figure 1:
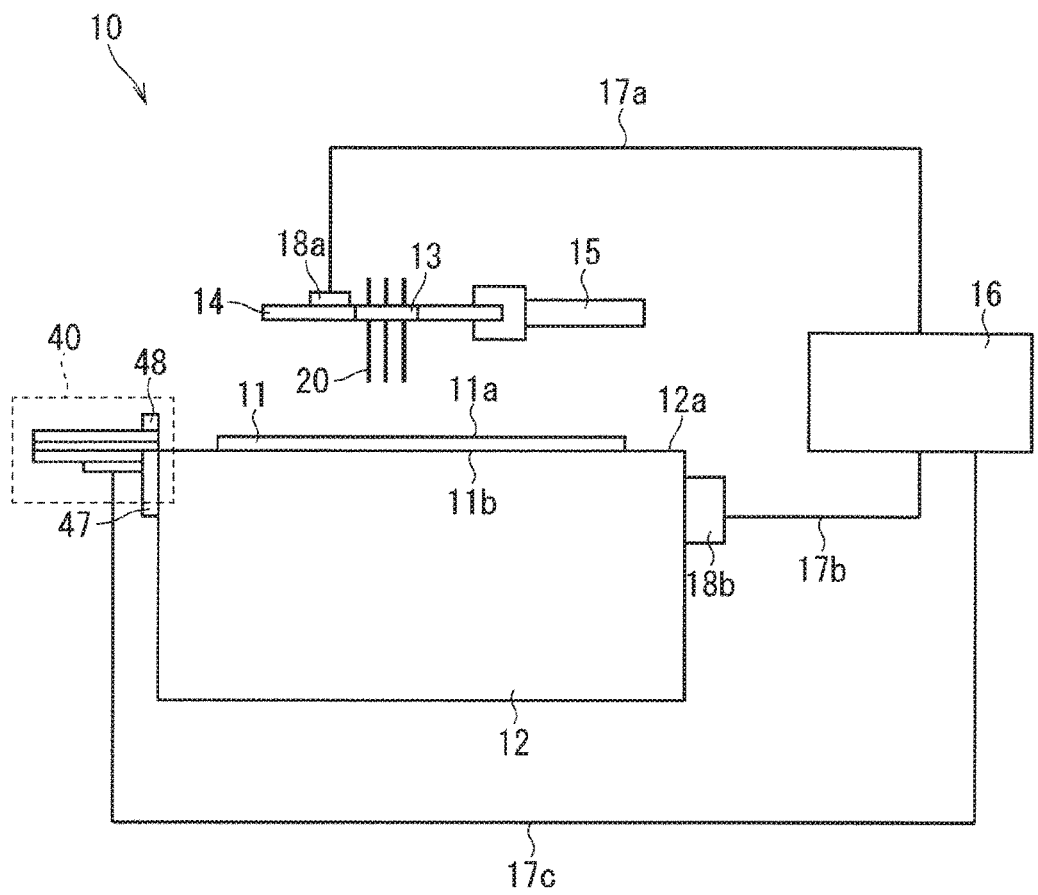
FIG. 1 schematically illustrates a structure of a probe position inspection device and a semiconductor evaluation apparatus according to Embodiment 1.

FIG. 1 schematically illustrates a structure of a probe position inspection device 40, and a semiconductor evaluation apparatus 10 including the probe position inspection device 40 according to Embodiment 1. The semiconductor evaluation apparatus 10 includes a stage 12 having a supporting surface 12a on which a subject semiconductor apparatus 11 is supported. Furthermore, the semiconductor evaluation apparatus 10 additionally includes probes 20 that transmit and receive electrical signals to and from the subject semiconductor apparatus 11 when evaluating the electrical characteristics of the subject semiconductor apparatus 11. Each of the probes 20 includes a contact part 21 (see FIG. 2A) that is in contact with an electrode (not illustrated) placed on a principal surface 11a of the subject semiconductor apparatus 11. Furthermore, the semiconductor evaluation apparatus 10 additionally includes an insulating plate 13 that supports the probes 20, and a probe base 14 that supports the insulating plate 13.

[Probes]

Figure 2A:
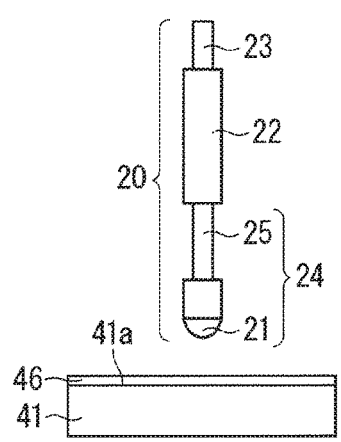
FIGS. 2A to 2C are side views illustrating structures of probes according to Embodiment 1.
Figure 2B:
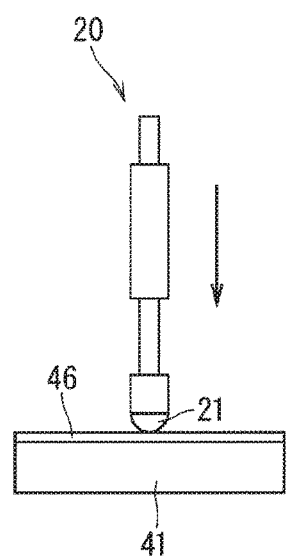
Figure 2C:
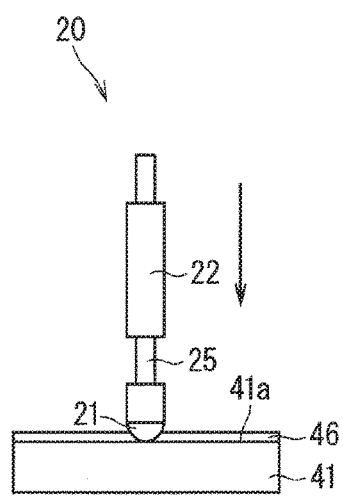

FIGS. 2A to 2C are side views schematically illustrating base structures of the probe 20 included in the semiconductor evaluation apparatus 10 according to Embodiment 1. Since the characteristics of the probe 20 will be described, the illustration of an inspection magnetic field producing part to be described later is omitted. The probe 20 includes the contact part 21 to be mechanically in contact with and electrically connected with an electrode (not illustrated) placed on the principal surface 11a when the subject semiconductor apparatus 11 is evaluated. The contact part 21 is placed at the end of the probe 20 according to Embodiment 1.

Although FIGS. 2A to 2C omit the illustration of the insulating plate 13 and the probe base 14 of the semiconductor evaluation apparatus 10, each of the probes 20 includes a barrel part 22 to be connected to the insulating plate 13, and an electrical connector 23 functioning as an external output terminal. The electrically connector 23 is electrically connected to a connector 18a through, for example, a metal line included in the insulating plate 13 and the probe base 14.

Furthermore, each of the probes 20 additionally includes a plunger part 24 having one end connected to the contact part 21 and the other end connected to the electrical connector 23 through a pressing part 25. The pressing part 25 has a structure in which an elastic object such as a spring is incorporated. The pressing part 25 has a function of reducing the stress applied to the contact part 21 by sliding when pressed against the contact part 21, when the contact part 21 is in contact with, for example, an electrode. FIG. 2C illustrates a sliding state of the pressing part 25 when the probe 20 is moved in an arrow direction and the contact part 21 is pressed against a protective part 46 on the base part 41. The base part 41 and the protective part 46 will be described later.

Although Embodiment 1 describes the probes 20 each including a slidable elastic object in the pressing part 25, the probes 20 are not limited to as such but may be probes each with an elastic object such as a spring placed outside. Furthermore, the probes 20 according to Embodiment 1 are not limited to have the structure as illustrated in FIG. 2A but may be, for example, cantilever probes, multi-layered probes, and wire probes.

The probes 20 have electrical conductivity. The probes 20 are mainly made of metal components, such as copper, tungsten, and rhenium tungsten. Furthermore, the surface of the contact part 21 is preferably covered with a material containing, for example, gold, palladium, tantalum, and platinum for protection to increase the conductivity and durability.

[Inspection Magnetic Field Producing Part]

Figure 3A:
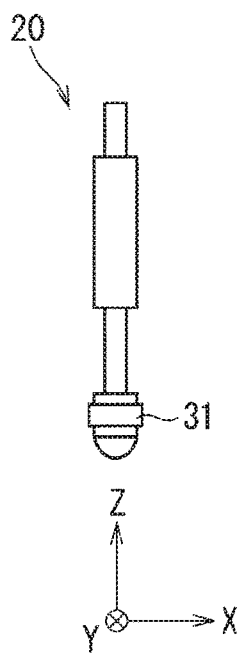
FIGS. 3A to 3F are side views each illustrating a structure of a probe included in a semiconductor evaluation apparatus according to the present invention.

FIG. 3A is a side view schematically illustrating a structure of the probe 20. The probe 20 included in the semiconductor evaluation apparatus 10 includes an inspection magnetic field producing part 31 that produces a magnetic field around the contact part 21. The inspection magnetic field producing part 31 included in the probe 20 according to Embodiment 1 is a ferromagnet having remanence, namely, a magnetized ferromagnet. Specifically, the probe 20 includes the ring-shaped inspection magnetic field producing part 31 placed around the plunger part 24 as illustrated in FIG. 3A. The inspection magnetic field producing part 31 is made of a ferromagnetic material. Examples of the ferromagnetic material include materials containing iron, cobalt, or nickel. Furthermore, the inspection magnetic field producing part 31 may contain, for example, carbon to maintain the magnetized state.

[Probe Position Inspection Device]

Figure 4:
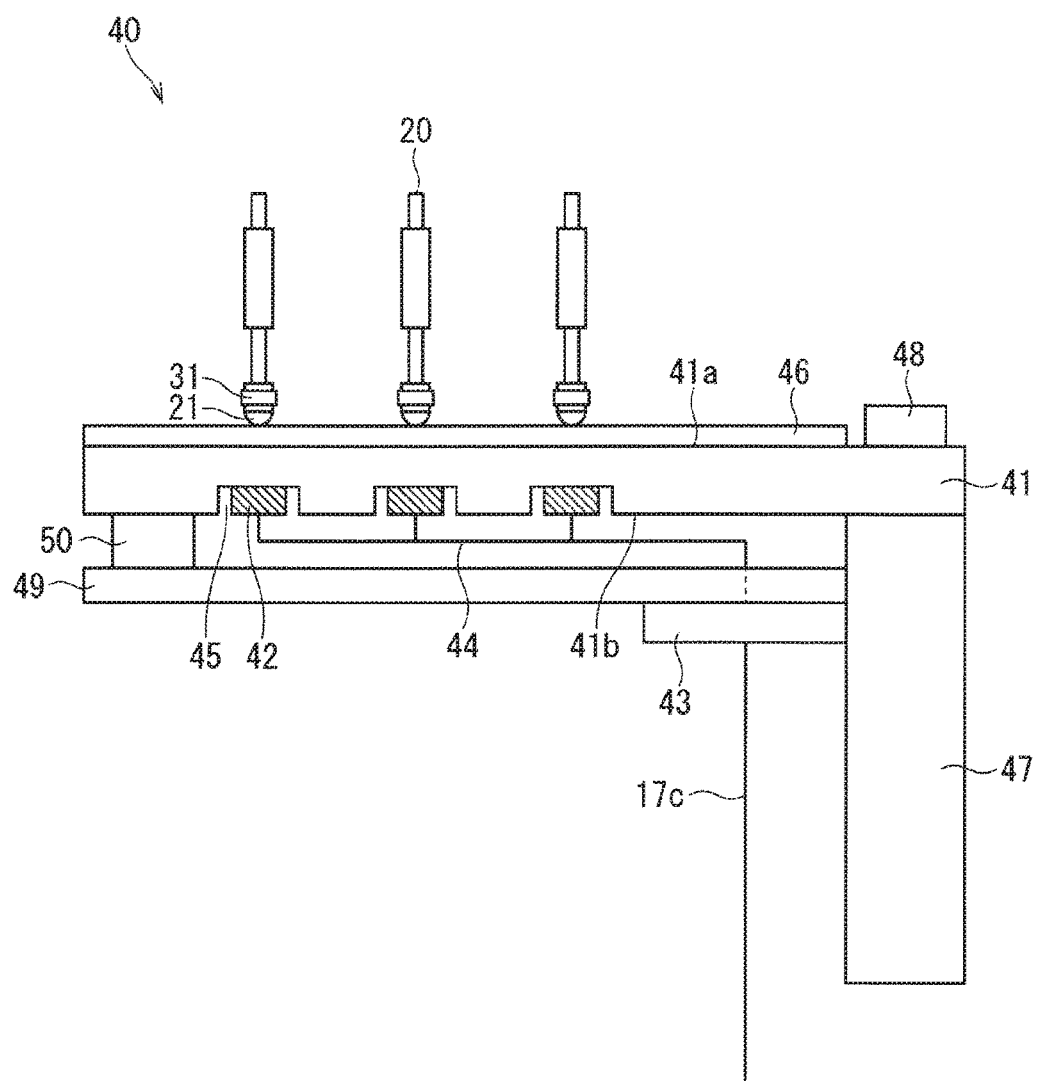
FIG. 4 is a cross-sectional view illustrating a structure of the probe position inspection device according to Embodiment 1.
Figure 4:
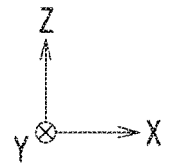

FIG. 4 is a cross-sectional view schematically illustrating a structure of the probe position inspection device 40. FIG. 4 illustrates a cross section of counterbored parts 45 in the base part 41, and omits the illustration of the insulating plate 13 that supports the probes 20. The probe position inspection device 40 includes the base part 41. The base part 41 includes a front surface 41a, and a back surface 41b opposite to the front surface 41a. The front surface 41a can face the contact parts 21 of the probes 20 to be in contact with each other. When the position of the probe 20 is inspected, the front surface 41a of the base part 41 is in contact with the contact part 21 of the probe 20.

The base part 41 includes magnetic field sensors 42 in a plane direction parallel to the front surface 41a. The probe position inspection device 40 further includes an output part 43 that externally outputs a signal corresponding to the magnetic field sensed by the magnetic field sensor 42. The magnetic field sensors 42 and the output part 43 are electrically connected through a line 44 provided closer to the back surface 41b of the base part 41. Each of the constituent elements of the probe position inspection device 40 will be hereinafter described in detail.

[Magnetic Field Sensors]

The base part 41 includes the magnetic field sensors 42 in the plane direction parallel to the front surface 41a. Each of the magnetic field sensors 42 senses a magnetic field produced by the inspection magnetic field producing part 31 included in the probe 20, specifically, a magnetic field produced by a ferromagnet according to Embodiment 1. According to Embodiment 1, the magnetic field sensors 42 are placed in the counterbored parts 45 provided in the back surface 41b of the base part 41. The magnetic field sensors 42 are placed in a matrix in the plane of the base part 41. The number of the magnetic field sensors 42 is preferably more than or equal to the number of the probes 20. According to Embodiment 1, the magnetic field sensors 42 identical in number to the probes 20 are placed.

Static magnetic field sensors that sense a static magnetic field in which the magnetic field is static are used as the magnetic field sensors 42. Furthermore, a Hall IC obtained by integrating a hall element and a processing circuit is used as the magnetic field sensor 42. The magnetic field sensor 42 according to Embodiment 1 is, for example, a linear output Hall IC. Furthermore, the magnetic field sensor 42 may be a binary output Hall IC. The linear output Hall IC or the binary output Hall IC is preferably selected depending on the signal processing on the signal output from the magnetic field sensor 42.

The magnetic field sensors 42 are electrically connected to the output part 43 through the line 44, and output the signals corresponding to the sensed magnetic fields to the output part 43. According to Embodiment 1, the line 44 is placed closer to the back surface 41b of the base part 41. The output part 43 has a function of externally outputting output signals from the magnetic field sensors 42. The output part 43 may output the signals through lines 44 connected to the respective magnetic field sensors 42. Alternatively, the output part 43 equipped with a switch may output only a signal from a desired one of the magnetic field sensors 42 through the lines 44.

[Base Part]

The probe position inspection device 40 measures a magnetic field for inspecting the position of the probe 20. The base part 41 in which the magnetic field sensors 42 are placed to sense the magnetic fields according to Embodiment 1 is made of a non-magnetic material to prevent the base part 41 itself from becoming a disturbance factor against the sensing. Furthermore, the base part 41 needs to possess the strength sufficient to withstand the stress caused by pressing the contact part 21 of the probe 20 against the base part 41 in inspecting the position of the probe 20. For example, when the base part 41 is deformed or broken by pressing the probe 20 against the base part 41, the position of the probe 20 cannot be accurately detected. For these reasons, the base part 41 is mainly made of an engineering plastic with a thickness of several mm according to Embodiment 1.

The engineering plastic is, for example, a resin with a heat resistance temperature of 100° C. or higher. Furthermore, the engineering plastic is, for example, a resin with a tensile strength of 50 MPa or higher. Furthermore, the engineering plastic is, for example, a resin with a bending modulus of elasticity of 2.4 MPa or higher. Furthermore, examples of the engineering plastics include, but not necessarily, polyacetal, polyamide, polycarbonate, modified polyphenylene ether, and polybutylene terephthalate.

Furthermore, the base part 41 may be mainly made of a stainless steel or a ceramic material. The base part 41 that is made of the engineering plastic, the stainless steel, or the ceramic material thus with little breakage or deterioration requires no replacement, and can be manufactured at a lower cost than that made of the other materials.

Furthermore, the base part 41 includes the protective part 46 on the front surface 41a. The protective part 46 is placed detachably from the front surface 41a to be replaceable. The protective part 46 is, but not necessarily, made of a soft material with flexibility, for example, a polyvinyl chloride (PVC) sheet filled with a conductive filler that is a conductive substance.

[Magnetic Shield]

The probe position inspection device 40 according to Embodiment 1 further includes a magnetic shield 49 placed at a back surface side, namely, above or on the back surface 41b of the base part 41. The magnetic shield 49 has a dimension sufficient to cover at least the magnetic field sensors 42 and the line 44. The magnetic shield 49 is a ferromagnetic part, and is preferably made of, for example, a Fe—Ni based metal. Examples of the Fe—Ni based metal include, but not necessarily, permalloy. The magnetic shield 49 is, for example, screwed into the base part 41.

Furthermore, the probe position inspection device 40 may include the magnetic shield 49 around the periphery of the base part 41, preferably, on a side surface of the base part 41. Furthermore, the probe position inspection device 40 may include the magnetic shield 49 placed at the back surface side, on the side surface, or both at the back surface side and on the side surface of the base part 41. The magnetic shield 49 reduces the magnetic field produced by a different source from the inspection magnetic field producing parts 31. Since the magnetic shield 49 shields such a magnetic field noise, the probe position inspection device 40 can accurately detect the positions of the probes 20.

[Temperature Sensor]

The probe position inspection device 40 according to Embodiment 1 further includes a temperature sensor 50 as a temperature sensing part that measures the ambient temperature of the magnetic field sensors 42. When the output of the magnetic field sensors 42 depends on the temperature, the output can be corrected using the output of the temperature sensor 50. According to Embodiment 1, an evaluator 16 corrects the output. When the temperature is stably managed, the correction using the temperature sensor 50 is unnecessary.

[Semiconductor Evaluation Apparatus]

Next, the structure of the semiconductor evaluation apparatus 10 including the probe position inspection device 40 will be described with reference to FIG. 1. The semiconductor evaluation apparatus 10 includes the stage 12 having the supporting surface 12a on which the subject semiconductor apparatus 11 is supported. The stage 12 includes a means that fixes a placing surface 11b of the subject semiconductor apparatus 11 to the supporting surface 12a with the surfaces being in contact with each other. Examples of the fixing means include a vacuum chuck and an electrostatic chuck. Furthermore, the stage 12 is, for example, a chuck stage.

The subject semiconductor apparatus 11 according to Embodiment 1 is a semiconductor apparatus with a vertical structure which passes a current between the principal surface 11a and the placing surface 11b. For the evaluation, the subject semiconductor apparatus 11 includes an electrode of one polarity on the principal surface 11a that is to be in contact with the contact part 21 of the probe 20, and an electrode of the other polarity on the placing surface 11b that is to be in contact with the supporting surface 12a of the stage 12 (none of the electrodes is illustrated). Although Embodiment 1 exemplifies the subject semiconductor apparatus 11 with the vertical structure which can pass a high current in an off-plane direction, namely, in a direction between the principal surface 11a and the placing surface 11b, the subject semiconductor apparatus 11 may be, but not limited to, a semiconductor apparatus with a horizontal structure that transmits and receives an electrical signal in an in-plan direction of the principal surface 11a. Furthermore, the subject semiconductor apparatus 11 may be, for example, a semiconductor chip diced from a semiconductor wafer or a semiconductor device on a wafer, but not limited to a subject semiconductor apparatus that can be fixed to the stage 12. Furthermore, as already described, the semiconductor evaluation apparatus 10 according to Embodiment 1 includes the probes 20. Accordingly, the semiconductor evaluation apparatus 10 can approximately unify the densities of the currents that flow through the respective probes 20. The semiconductor evaluation apparatus 10 enables, for example, a current higher than or equal to 5 A to flow through the subject semiconductor apparatus 11.

The semiconductor evaluation apparatus 10 additionally includes a movable arm 15 connected to the probe base 14, besides the probe base 14 that supports the insulating plate 13 connected to the probes 20. With the movement of the movable arm 15, the positions of the probes 20 relative to the stage 12 are changed. Although Embodiment 1 exemplifies a structure in which the single movable arm 15 supports the probe base 14, movable arms 15 may, but not necessarily, stably support the probe base 14. Furthermore, the positions of the probes 20 relative to the subject semiconductor apparatus 11 may be changed not only by moving the probe base 14 using the movable arm 15, but also by moving the stage 12 relative to the subject semiconductor apparatus 11.

Furthermore, the semiconductor evaluation apparatus 10 further includes the evaluator 16 that evaluates the electrical characteristics of the subject semiconductor apparatus 11. Furthermore, the semiconductor evaluation apparatus 10 further includes a signal line 17a and a connector 18a that electrically connect the evaluator 16 and the probes 20. Although the electrical connection between the connector 18a and the probes 20 is not illustrated, the connector 18a and the probes 20 are electrically connected through, for example, the metal line included in the insulating plate 13 and the probe base 14.

Furthermore, the semiconductor evaluation apparatus 10 further includes a signal line 17b and a connector 18b that electrically connect the evaluator 16 and the supporting surface 12a. Although the electrical connection between the connector 18b and the supporting surface 12a is not illustrated, as long as the whole stage is manufactured by a conductor, there is continuity between the connector 18b and the supporting surface 12a. The connector 18b and the supporting surface 12a may be electrically connected through, for example, a metal line. Furthermore, the connector 18a and the connector 18b are preferably wired so that the distances from the connector 18a to the connector 18b through any of the probes 20 are approximately identical with one another.

[Connection Between Probe Position Inspection Device and Semiconductor Evaluation Apparatus]

The semiconductor evaluation apparatus 10 further includes a holder 47 that supports the base part 41 included in the probe position inspection device 40. Furthermore, the semiconductor evaluation apparatus 10 further includes a second detachable part 48 that detachably connects the base part 41 to the holder 47. In other words, the probe position inspection device 40 is connected to the semiconductor evaluation apparatus 10 through the second detachable part 48 and the holder 47.

When the probe position inspection device 40 is connected to the semiconductor evaluation apparatus 10 through the second detachable part 48 and the holder 47, the front surface 41a of the base part 41 is preferably connected to the semiconductor evaluation apparatus 10 to be in parallel with the supporting surface 12a. Furthermore, the probe position inspection device 40 is preferably connected to the semiconductor evaluation apparatus 10 such that the respective heights of the front surface 41a and the supporting surface 12a are approximately the same. Furthermore, the base part 41 and the stage 12 are preferably connected to be adjacent to each other. The holder 47 is preferably made of a material of strength sufficient to hold the probe position inspection device 40, for example but not limited to, metals including a stainless steel.

Examples of the second detachable part 48 include a screw. Furthermore, the second detachable part 48 enables the base part 41 to be replaceable. For example, replacing the current base part 41 with another base part having a different arrangement of the magnetic field sensors 42 in the probe position inspection device 40 enables the probes 20 with various arrangements to be inspected.

Furthermore, the output part 43 of the probe position inspection device 40 is electrically connected to the evaluator 16 of the semiconductor evaluation apparatus 10 through a signal line 17c according to Embodiment 1. The output part 43 outputs an output signal of each of the magnetic field sensors 42 in the base part 41 to the evaluator 16. The evaluator 16 calculates the position of the probe 20 using the output signal.

[Probe Position Inspection Method]

Next, operations of the semiconductor evaluation apparatus 10 including the probe position inspection device 40, and a method for inspecting the position of the probe 20 using the probe position inspection device 40 will be described. Embodiment 1 exemplifies a case where the probe position inspection device 40 inspects the positions of the probes 20 before the semiconductor evaluation apparatus 10 evaluates the subject semiconductor apparatus 11. In summary, the probe position inspection device 40 brings the probes 20 each including the inspection magnetic field producing part 31 in contact with the base part 41 including the protective part 46. Here, the probes 20 are pressed against the base part 41 under a load approximately closer to the load in the actual evaluation. Each of the magnetic field sensors 42 measures the magnitude of the magnetic field, and converts the magnitude into an electrical signal to output the electrical signal. The evaluator 16 analyzes a result of the output, and calculates a position of each of the contact parts 21 of the probes 20. The following will describe the detailed steps.

As illustrated in FIG. 3A, the probe 20 including the inspection magnetic field producing part 31 is prepared (1st step). According to Embodiment 1, the inspection magnetic field producing part 31 is magnetized and ring-shaped, is made of a ferromagnetic material, and is placed around the plunger part 24. Then, the probe 20 produces a magnetic field around the contact part 21.

Next, the semiconductor evaluation apparatus 10 fixes the placing surface 11b of the subject semiconductor apparatus 11 to the supporting surface 12a of the stage 12 by vacuum suction as illustrated in FIG. 1 (2nd step). The orders of the 1st step and the 2nd step may be reversed.

Next, the semiconductor evaluation apparatus 10 moves the probes 20 including the inspection magnetic field producing parts 31 onto the base part 41 included in the probe position inspection device 40, using the movable arm 15. After approximately adjusting the positions at which the probes 20 are in contact with the base part 41, the semiconductor evaluation apparatus 10 brings the probed 20 in contact with the protective part 46 on the base part 41 and presses the probed 20 against the protective part 46, under the same load as that when evaluating the electrical characteristics of the subject semiconductor apparatus 11 (3rd step).

Here, the operation of bringing the probes 20 in contact with the base part 41 at the 3rd step will be described with reference to FIGS. 2A to 2C. Although the operation of bringing the probes 20 in contact with the base part 41 included in the probe position inspection device 40 will be described herein, the same holds true for an operation of bringing the probes 20 in contact with the subject semiconductor apparatus 11. FIG. 2A to 2C illustrate respective states of the probe 20 when the probe 20 is brought in contact with the front surface 41a of the base part 41 covered with the protective part 46. FIG. 2A illustrates an initial state before the probe 20 is in contact with the front surface 41a. FIG. 2B illustrates a state where the contact part 21 is in contact with the protective part 46 by moving the probe 20 downward in a minus Z direction, namely, in the arrow direction in FIG. 2B to bring the probe 20 closer to the front surface 41a. FIG. 2C illustrates a state where the probe 20 is further moved downward in the minus Z direction. The contact part 21 of the probe 20 is in contact with the front surface 41a by sliding and pressing the pressing part 25 using the elastic object included in the barrel part 22. Specifically, pressing the probe 20 toward the base part 41 enables the contact part 21 to be reliably in contact with the front surface 41a, thus stabilizing the contact point. When the probe position inspection device 40 including the base part 41 including the protective part 46 inspects the position of the probe 20, the front surface 41a to be in contact with the contact part 21 may be read as the protective part 46 in the Specification. More specifically, pressing the probe 20 toward the base part 41 enables the contact part 21 to be reliably in contact with the protective part 46 and stabilize the contact point, thus producing an advantage of the present invention. Although the magnetic field sensor 42 is not illustrated in FIG. 2C, a distance between the contact part 21 and the magnetic field sensor 42 becomes closer by pressing the contact part 21 against the protective part 46.

Following the 3rd step, the magnetic field sensors 42 placed in the plane of the base part 41 sense the magnetic fields produced by the respective inspection magnetic field producing parts 31, namely, ferromagnets of the probes 20 that are in contact with the base part 41, and output signals based on the sensed magnetic fields (4th step). Specifically, the magnetic field sensors 42 sense the magnetic fields in a state where the probes 20 are pressed against the base part 41 under the same load as that in the evaluation.

The magnetic field sensors 42 output the output signals to the output part 43 through the line 44. As illustrated in FIGS. 1 and 4 according to Embodiment 1, since the output part 43 is electrically connected to the evaluator 16 through the signal line 17c, the output part 43 outputs the output signals of the magnetic field sensors 42 to the evaluator 16. The evaluator 16 calculates the positions of the contact parts 21 of the probes 20 based on the output signals (5th step). When the magnetic fields in a sensing direction that is sensed by the magnetic field sensors 42 reach a predetermined level, the evaluator 16 estimates that the probes 20 are in contact with a portion in the vicinity of the magnetic field sensors 42.

Figure 5:
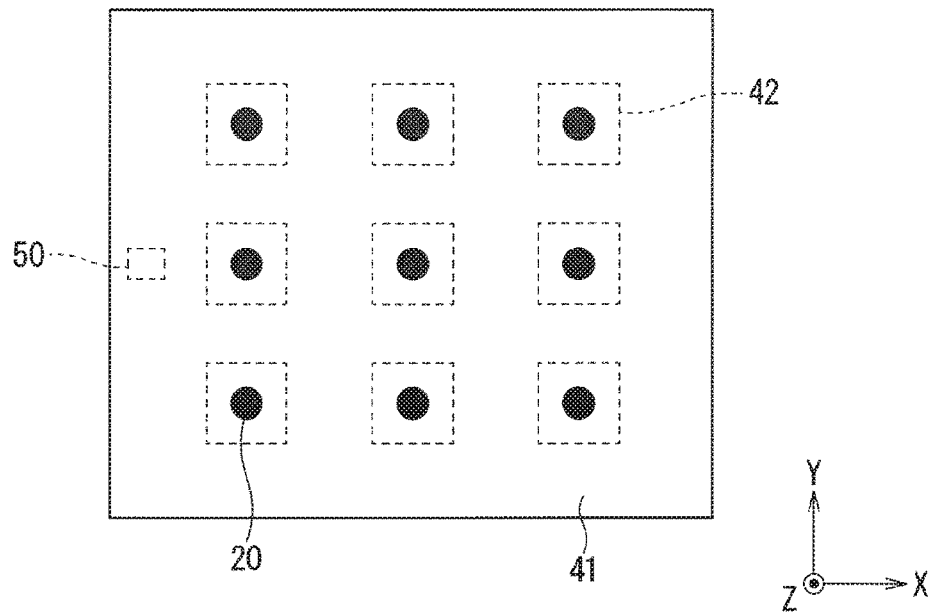
FIG. 5 is a plan view of a base part for displaying a result of inspection on positions of probes according to Embodiment 1.
Figure 6:
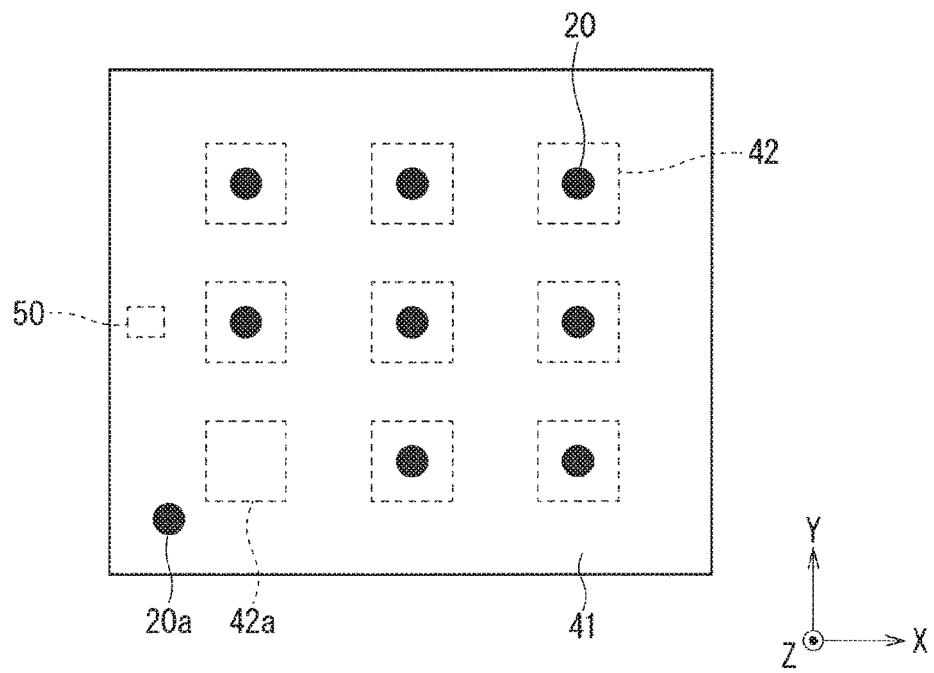
FIG. 6 is a plan view of a base part for displaying a result of inspection on positions of probes according to Embodiment 1.

FIG. 5 is a plan view of the base part 41 for showing contact points of the contact parts 21 (illustrated by black circles) sensed by nine of the magnetic field sensors 42 (illustrated by dotted rectangles) placed in the plane of the base part 41, when nine of the probes 20 placed in normal positions are brought in contact with the base part 41. Here, any output signals of the magnetic field sensors 42 take on similar values. FIG. 6 is a plan view of the base part 41 for showing positions of the contact parts 21 sensed by the magnetic field sensors 42 when a probe 20a at the lower left is displaced. The output signal of a magnetic field sensor 42a closer to the probe 20a has an abnormal value compared to the output signals of the other eight magnetic field sensors 42. Since the magnetic field sensors 42 according to Embodiment 1 are linear output Hall ICs, the output signal from the magnetic field sensor 42a is smaller than those of the other magnetic field sensors 42. When the magnetic field sensors 42 are magnetic field sensors of a binary value output type, only the magnetic field sensor 42a outputs an OFF signal. Specifically, the magnetic field sensors 42 with higher sensitivity than a threshold output an ON signal, whereas the magnetic field sensors 42 with lower sensitivity than the threshold output the OFF signal. As described above, the probe position inspection device 40 can accurately inspect the positions of the contact parts 21 of the probes 20, in the plane of the base part 41 at the 5th step.

When detecting abnormality in the position of the probe 20, the semiconductor evaluation apparatus 10 suspends the processes of evaluating the electrical characteristics of the subject semiconductor apparatus 11 to be performed later (6th step). Accordingly, the user of the probe position inspection device 40 can check and correct the position of the probe 20.

Without any abnormality detected at the positions of the probes 20, the user detaches the inspection magnetic field producing parts 31, namely, the ferromagnets attached to the probes 20 as necessary. Particularly, when the magnetic field induced by the remanence in the ferromagnets may affect the evaluation on the electrical characteristics of the subject semiconductor apparatus 11, the user may preferably detach the inspection magnetic field producing parts 31 from the probes 20. Furthermore, when, for example, a magnetic device is evaluated, it is preferred to detach the inspection magnetic field producing parts 31 from the probes 20 (7th step).

The semiconductor evaluation apparatus 10 moves the probes 20 onto the subject semiconductor apparatus 11 using the movable arm 15 (8th step). Then, the semiconductor evaluation apparatus 10 brings the probes 20 in contact with the electrodes located on the principal surface 11*a* of the subject semiconductor apparatus 11 to evaluate the electrical characteristics (9th step).

Although the probe position inspection device 40 inspects the positions of the probes 20 before evaluating the electrical characteristics of the subject semiconductor apparatus 11 according to Embodiment 1, the inspection timing is not limited to such. Furthermore, the probe position inspection device 40 may inspect the positions of the probes 20 for each of the subject semiconductor apparatuses 11 or at predetermined frequency.

[Advantages]

As described above, the probe position inspection device 40 according to Embodiment 1 is a probe position inspection device that inspects the position of the probe 20 included in the semiconductor evaluation apparatus 10, the probe 20 including the inspection magnetic field producing part 31 that produces a magnetic field corresponding to a contact point with the subject semiconductor apparatus 11, the probe position inspection device 40 including: the base part 41 having the front surface 41*a* that can be contacted by the probe 20, and including a plurality of the magnetic field sensors 42 placed in a plane parallel to the front surface 41*a*, each of the magnetic field sensors 42 sensing the magnetic field produced by the inspection magnetic field producing part 31; and the output part 43 electrically connected to the magnetic field sensors 42, the output part 43 outputting, based on the magnetic field, a signal corresponding to each of the magnetic field sensors 42. With the structure above, the probe position inspection device 40 can inspect the positions of the probes 20 without using traces of probes. Specifically, the probe position inspection device 40 does not require the inspection using, for example, a deformable body and a needle trace transfer member as described in Patent Documents 1 and 2, respectively, thus enabling reduction in the time and cost for inspecting the positions of the probes 20. Furthermore, the probe position inspection device 40 does not include any image capturing means and thus does not require consideration of, for example, the disturbance factors in capturing images. Accordingly, the probe position inspection device 40 can accurately inspect the positions of the probes 20.

Furthermore, the semiconductor evaluation apparatus 10 according to Embodiment 1 includes: the probe position inspection device 40; the stage 12 that supports the subject semiconductor apparatus 11; the probe 20; and the evaluator 16 that transmits and receives, through the probe 20, an electrical signal to and from the subject semiconductor apparatus 11 placed on the stage 12, and evaluates electrical characteristics of the subject semiconductor apparatus 11. With the structure above, the semiconductor evaluation apparatus 10 can accurately inspect the positions of the probes 20 before evaluating, for example, the electrical characteristics of the subject semiconductor apparatus 11. As a result, it is possible to reduce a frequency of problems in displacement of a contact position between an electrode included in the subject semiconductor apparatus 11 and the probe 20. Examples of the problems include a problem in no application of a desired current or voltage to the subject semiconductor apparatus 11 and a problem in that the subject semiconductor apparatus 11 breaks because the probe 20 is in contact with a region different from the electrode to be originally in contact with the probe 20.

A method for inspecting the position of the probe 20 using the semiconductor evaluation apparatus 10 according to Embodiment 1 includes: bringing the probe 20 in contact with the front surface 41*a* of the base part 41; sensing the magnetic field produced by the inspection magnetic field producing part 31 included in the probe 20, the sensing being performed by each of the magnetic field sensors 42 included in the base part 41; and outputting an output signal based on the magnetic field sensed in the sensing, the outputting being performed by the output part 43. With the method, it is possible to obtain, from the output part 43, a signal of the magnetic field sensor 42 for inspecting the position of the probe 20 without using the traces of the probe 20. For example, the position of the probe 20 can be accurately calculated by entering the signal from the output part 43 into hardware and analyzing a resulting signal. The method does not require the inspection using, for example, a deformable body and a needle trace transfer member as described in Patent Documents 1 and 2, respectively, thus enabling reduction in the time to inspect the position of the probe 20. Furthermore, the method does not use any image capturing means and thus does not require consideration of, for example, the disturbance factors in capturing images. Accordingly, the positions of the probes 20 can be accurately inspected.

Furthermore, the method further includes analyzing the output signal obtained in the outputting, and calculating a contact point at which the probe 20 is in contact with the front surface 41*a* of the base part 41, the analyzing and the calculating being performed by the evaluator 16. With the structure, the evaluator 16 included in the semiconductor evaluation apparatus 10 can analyze the signal of the magnetic field sensor 42 and accurately calculate the position of the probe 20.

Furthermore, the structure of the probe position inspection device 40 and the semiconductor evaluation apparatus 10 according to Embodiment 1 produces the advantages to be described below.

The inspection magnetic field producing part 31 included in the probe 20 according to Embodiment 1 is a ferromagnet. With the structure, a magnetic field is produced around the probe 20 including the inspection magnetic field producing part 31. As a result, the magnetic field sensors 42 included in the probe position inspection device 40 can sense the magnetic fields and accurately calculate the positions of the probes 20.

The base part 41 included in the probe position inspection device 40 has the back surface 41*b* opposite to the front surface 41*a*, and the magnetic field sensors 42 are placed at the back surface 41*b*. Since this structure can avoid the direct contact between the probes 20 and the magnetic field sensors 42, the probe position inspection device 40 prevents physical damage caused by the contact. In contrast to sensors that require electric contact, the magnetic field sensor 42 can detect the position of the probe 20 even when not in contact with the probe 20.

The base part 41 included in the probe position inspection device 40 includes the counterbored parts 45, and the magnetic field sensors 42 are placed in the counterbored parts 45. Accordingly, the magnetic field sensors 42 can be easily aligned over the base part 41 when placed. Furthermore, since a portion of the base part 41 without the counterbored part 45 in the plane is thicker than a portion of the base part 41 with the counterbored part 45, the probe position inspection device 40 can ensure the strength against an external stress such as the contact of the probes 20. Furthermore, since the magnetic field sensors 42 are placed in the counterbored parts 45 on the back surface 41b, the distance each between the magnetic field sensor 42 and the probe 20 can be shortened, and the accuracy for sensing the magnetic field will be improved.

The magnetic field sensors 42 included in the probe position inspection device 40 are static magnetic field sensors each of which senses a static magnetic field. Accordingly, the probe position inspection device 40 does not need to vary the distances between the magnetic field sensors 42 and the probes 20 when sensing the magnetic fields. Specifically, as described according to Embodiment 1, the probe position inspection device 40 can inspect the positions of the probes 20 with the contact parts 21 of the probes 20 pressed against the base part 41, thus enabling accurate detection of the positions thereof.

The magnetic field sensors 42 included in the probe position inspection device 40 are linear output Hall ICs or binary output Hall ICs These Hall ICs are each obtained by integrating a hall element and a processing circuit, thus enabling construction of an output processing circuit at a lower cost than those of the other magnetic field sensors. Furthermore, since the linear output Hall IC outputs a signal corresponding to a magnitude of the sensed magnetic field, it can easily calculate the distance between the probe 20 and the magnetic field sensor 42. Furthermore, since the linear output Hall IC can easily change a detection threshold according to a magnetized state of the inspection magnetic field producing part 31 included in the probe 20, the detection accuracy can be improved. Compared to the other magnetic field sensors, the binary output Hall IC can simplify the structure of an output processing circuit.

The base part 41 included in the probe position inspection device 40 includes a non-magnetic material. Accordingly, since the base part 41 itself does not become a disturbance factor in sensing a magnetic field, the probe position inspection device 40 can accurately detect the positions of the probes 20.

Using engineering plastics as the material of the base part 41 can prevent the base part 41 from being deformed by the stress caused by the contact of the probes 20. Thus, the probe position inspection device 40 can inspect the positions of the probes 20 with higher precision. Furthermore, since the engineering plastics are less likely to have breakage or deterioration with its strength even in long-time repetitive use, the necessity of replacing the base part 41 due to, for example, the breakage or deterioration is low. Furthermore, the engineering plastics can be easily processed, and the counterbored parts 45 can be easily formed at a lower cost through, for example, injection molding. Furthermore, the engineering plastics are less expensive than the other materials having the characteristics of the engineering plastics described above. Furthermore, the base part 41 including a stainless steel or a ceramic material has little breakage or deterioration and requires no replacement, and can be manufactured at a lower cost than those of the other materials.

The base part 41 included in the probe position inspection device 40 further includes the protective part 46 that protects the front surface 41a. The protective part 46 protects the base part 41 and the contact part 21 from the stress caused when the probes 20 are pressed against the front surface 41a of the base part 41. Furthermore, the protective part 46 enables the base part 41 to be repeatedly used for a long time, and can reduce the necessity of replacing the base part 41.

The semiconductor evaluation apparatus 10 included in the probe position inspection device 40 further includes the holder 47 that supports the base part 41 with connection; and the second detachable part 48 that detachably connects the base part 41 to the holder 47. Accordingly, the base part 41 becomes replaceable. The semiconductor evaluation apparatus 10 can inspect the positions of the probes 20 with various arrangements by, for example, replacing the current base part 41 with another base part having a different arrangement of the magnetic field sensors 42 or external magnetic field applying parts 52 to be described in Embodiment 2. Furthermore, the probe position inspection device 40 can be later added to the semiconductor evaluation apparatus 10 with ease.

The probe position inspection device 40 further includes the magnetic shield 49 placed at the back surface side or around the periphery of the base part 41. The structure reduces a magnetic field produced by a different source from the inspection magnetic field producing parts 31, or the external magnetic field applying parts 52 to be described in Embodiment 2. Since the magnetic shield 49 shields such a magnetic field noise, the probe position inspection device 40 can accurately detect the positions of the probes 20.

The probe position inspection device 40 further includes the temperature sensor 50 as a temperature sensing part that measures the ambient temperature of the magnetic field sensors 42. Since the temperature sensor 50 can correct an output signal of the magnetic field sensor 42 using the output signal of the temperature sensor 50, the position of the probe 20 can be accurately detected without depending on a temperature at an inspection environment.

Modifications of Embodiment 1

Although a probe position inspection device, a semiconductor evaluation apparatus including the probe position inspection device, and a method for inspecting a position of a probe using the probe position inspection device are described based on Embodiment 1, the advantages produced by the present invention are not limited by Embodiment 1. The following will describe modifications of Embodiment 1 and its advantages.

[Modifications of Inspection Magnetic Field Producing Parts]

The probes 20 of the semiconductor evaluation apparatus 10 may include a magnetic material for applying magnetic properties. Specifically, the magnetic field for inspecting the positions of the probes 20 may be provided by the material contained in the probes 20. Preferably, the magnetic material is a ferromagnetic material, and includes, for example, iron, cobalt, nickel, or an alloy of these. The magnetic properties applied to the probes 20 eliminate the need of separately adding the inspection magnetic field producing parts 31, and ease the handling of the probes 20.

Figure 3B:
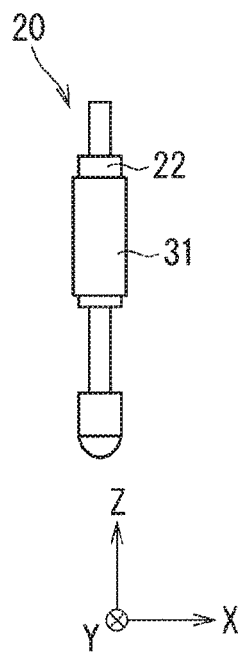

Although the inspection magnetic field producing parts 31 are added to the plunger parts 24 included in the probes 20, the positions at which the inspection magnetic field producing parts 31 are added are not limited to such. As illustrated in FIG. 3B, for example, the probe 20 may be a probe including the cylindrical inspection magnetic field producing part 31 at the barrel part 22, which can be easily attached.

Figure 3C:
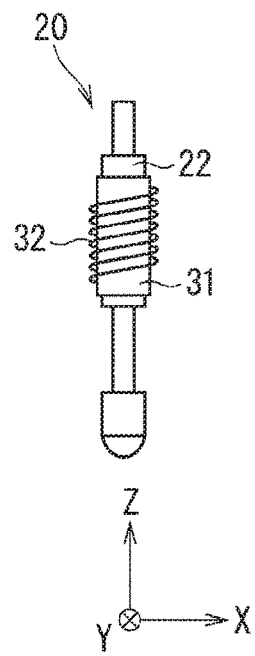
Figure 7:
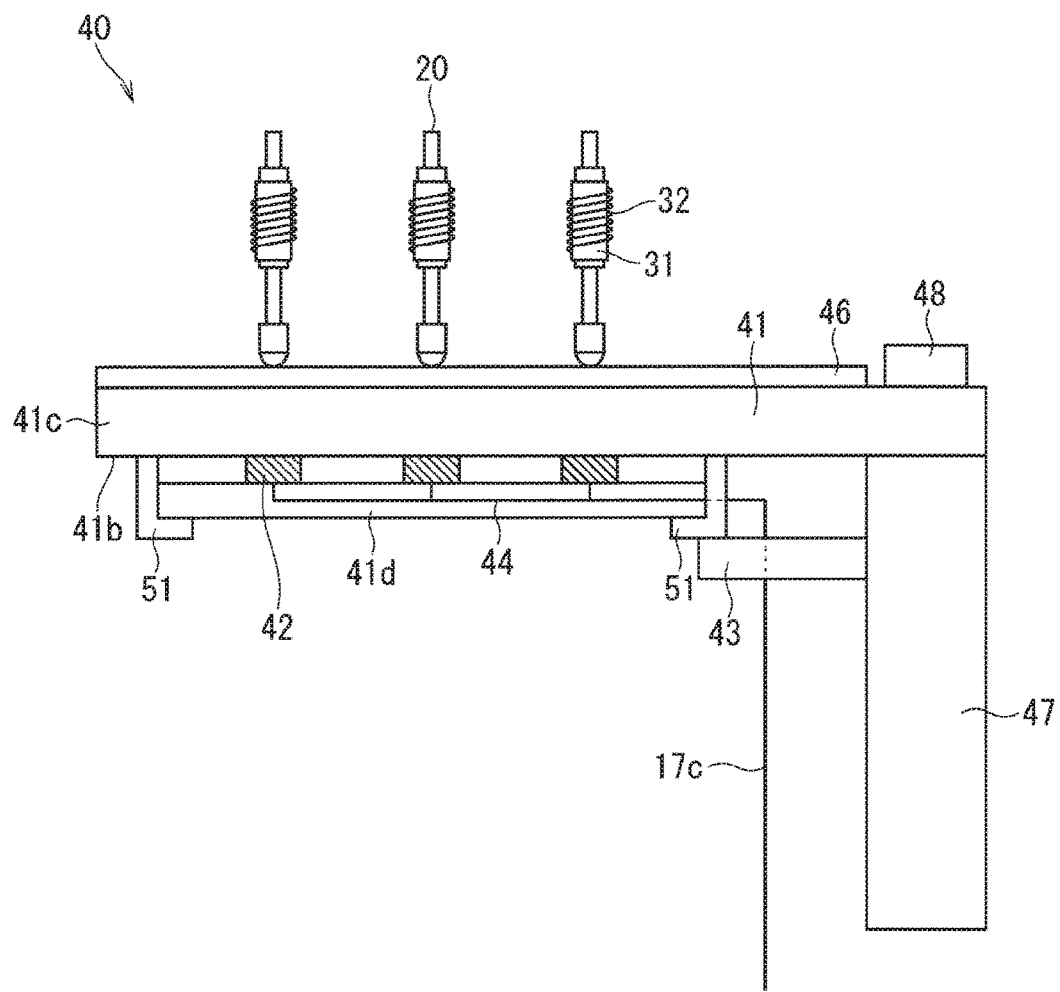
FIG. 7 schematically illustrates a structure of a probe position inspection device including a sensor substrate according to modifications of Embodiment 1.

The semiconductor evaluation apparatus 10 may include a magnetizer 32 that magnetizes a ferromagnet that is the inspection magnetic field producing part 31 with application of a ring current around the ferromagnet. The inspection magnetic field producing part 31 may be a ferromagnet having remanence with application of a magnetic field for magnetization. Specifically, as the inspection magnetic field producing part 31, a magnetized ferromagnet may be placed on the probe 20, or a ferromagnet to be magnetized may be placed on the probe 20 and then magnetized by the magnetizer 32. Furthermore, the semiconductor evaluation apparatus 10 may additionally magnetize a ferromagnet to increase a magnitude of the magnetization. FIG. 3C illustrates the example of the magnetizer 32. The semiconductor evaluation apparatus 10 includes, as the magnetizer 32, a coil around the cylindrical inspection magnetic field producing part 31 placed on the barrel part 22, thus enabling the cylindrical inspection magnetic field producing part 31 to be magnetized with application of a ring current around the cylindrical inspection magnetic field producing part 31. FIG. 7 illustrates an example of the probe position inspection device 40 including the cylindrical inspection magnetic field producing parts 31 and the magnetizers 32 as illustrated in FIG. 3C.

Figure 3D:
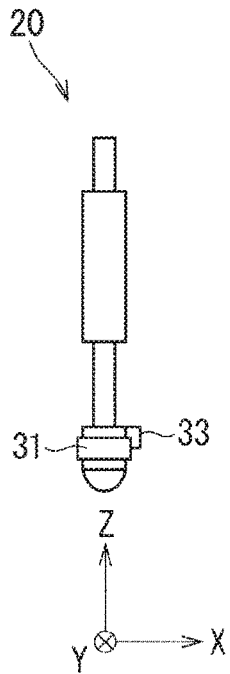

Furthermore, the structure of the magnetizer 32 is not limited to the structure above. For example, the probe 20 in FIG. 3D includes, in addition to the ring-shaped inspection magnetic field producing part 31, a permanent magnet 33 as a magnetizer in the vicinity of the inspection magnetic field producing part 31. The permanent magnet 33 is placed in a cutout part that is a part of the ring-shaped inspection magnetic field producing part 31. The probe 20 may include permanent magnets 33. Examples of a means for placing the permanent magnets 33 include an engagement structure and an adhesion structure. Inclusion of the permanent magnet 33 in the probe 20 can maintain the magnetized state of the inspection magnetic field producing part 31. When the probe 20 includes the permanent magnet 33 not as a magnetizer but as the inspection magnetic field producing part 31, it produces the same advantages as those according to Embodiment 1.

The inspection magnetic field producing part 31 included in the semiconductor evaluation apparatus 10 preferably has a structure detachable from the probe 20. Examples of the detachable structure include an engagement structure and an adhesion structure. With the inspection magnetic field producing part 31 being detachable from the probe 20, the inspection magnetic field producing part 31 can be easily replaced. For example, the inspection magnetic field producing part 31 can be easily replaced according to the magnitude of a magnetic field necessary to inspect the position of the probe 20. Furthermore, when the subject semiconductor apparatus 11 to be evaluated is a magnetic device, the inspection magnetic field producing parts 31 can be detached after inspection of the positions of the probes 20 so as not to affect the evaluation on the electrical characteristics of the magnetic device. For example, the ring-shaped inspection magnetic field producing part 31 illustrated in FIG. 3A is fixed to the probe 20 with the engagement structure. For example, the cylindrical inspection magnetic field producing part 31 illustrated in FIG. 3B is fixed to the probe 20 with the adhesion structure. For example, in the probe 20 illustrated in FIG. 3D, the cutout part in the ring-shaped inspection magnetic field producing part 31 and the part of the permanent magnet 33 are fixed by the engagement structure.

Figure 3E:
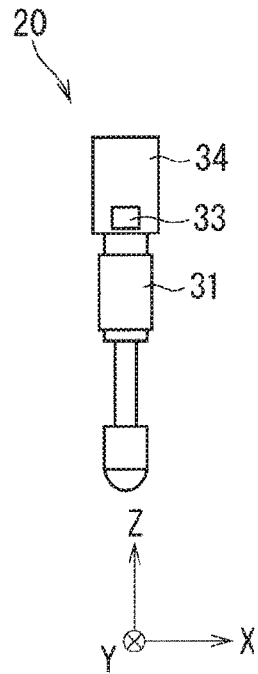

The semiconductor evaluation apparatus 10 may further include a third detachable part that detachably connects the probe 20 to the semiconductor evaluation apparatus 10, and the third detachable part may be the inspection magnetic field producing part 31. FIG. 3E illustrates an example of the probe 20 including a socket 34 as the third detachable part. In other words, the socket 34 may be, for example, a ferromagnet having remanence.

Figure 3F:
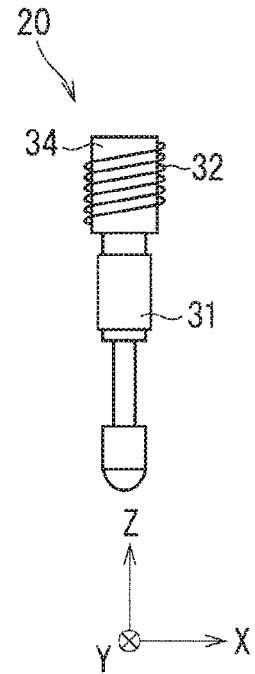

Furthermore, the socket 34 may be a ferromagnet that can be magnetized by a magnetic field for magnetization. In such a case, the socket 34 may include the permanent magnet 33 in a cutout part that is a part of the socket 34, as a magnetizer. Examples of a means for placing the permanent magnet 33 include an engagement structure and an adhesion structure, and the permanent magnet 33 is detachable. Furthermore, the semiconductor evaluation apparatus 10 may include, as the magnetizer 32, a coil around the socket 34 as illustrated in FIG. 3F. In addition to the structure above, the probe 20 may include the inspection magnetic field producing part 31 separately from the socket 34. With the semiconductor evaluation apparatus 10 including the socket 34 as the third detachable part, the probe 20 can be replaced without detaching the coil, thus enabling improvement in the maintenance of the semiconductor evaluation apparatus 10 and reduction of the cost thereof.

[Modifications of Magnetic Field Sensors]

The magnetic field sensors 42 may be placed on the front surface 41a of the base part 41. The magnetic field sensors 42 placed on the front surface 41a can sense the magnetic fields produced by the inspection magnetic field producing parts 31 with higher sensitivity, thus improving the accuracy of inspecting the positions of the probes 20.

The number of the magnetic field sensors 42 to be arranged is preferably more than or equal to the number of the probes 20 to be arranged. Accordingly, the accuracy of inspecting the positions of the probes 20 will be improved with the arrangement of the magnetic field sensors 42. Meanwhile, the arrangement and the number of the magnetic field sensors 42 are determined according to a desired accuracy of inspecting the positions of the probes 20, in consideration of the complexities of lines to be connected to the magnetic field sensors 42 and processes on output signals from the magnetic field sensors 42. In other words, the arrangement and the number of the magnetic field sensors 42 are determined, in consideration of the pad size of a subject semiconductor apparatus to be actually evaluated.

The magnetic field sensors 42 included in the probe position inspection device 40 are preferably magnetic field sensors each of which senses, as a sensing direction, a magnetic field component in a direction different from an in-plan direction that is parallel to the front surface 41a. In other words, the off-plane direction of the magnetic field sensors 42 is preferably the sensing direction. Accordingly, the positions of the probes 20 can be inspected with higher precision, irrespective of variations in height of the ends of the probes 20.

The base part 41 included in the probe position inspection device 40 may include: a main base 41c; a sensor substrate 41d including the magnetic field sensors 42; and a first detachable part 51 that attaches and detaches the sensor substrate 41d to and from the main base 41c. FIG. 7 schematically illustrates a structure of the probe position inspection device 40 including the sensor substrate 41d on the back surface 41b. The sensor substrate 41d is, for example, a substrate obtained by mounting the magnetic field sensors 42 on a printed wiring board (PWB). The sensor substrate 41d easily determines a position on the base part 41 at which each of the magnetic field sensors 42 is attached.

Furthermore, the line 44 for outputting an output signal of each of the magnetic field sensors 42 to the output part 43 is provided on the sensor substrate 41d. In the line 44, line patterns are formed to correspond to combinations of arrangements of the magnetic field sensors 42. The magnetic field sensors 42 are placed in the line patterns of the line 44 to be detachable from the sensor substrate 41d. Furthermore, the sensor substrate 41d is, for example, a PWB. In such a case, a conducting part of the line 44 can be easily formed by patterning, thus enabling reduction in the cost. As such, use of the sensor substrate 41d can reduce the complexities associated with the maintenance of the magnetic field sensors 42, such as replacement of the magnetic field sensors 42 when the lines 44 are placed. Furthermore, change in the arrangement of the probes 20 can be coped with by solely replacing a PWB.

Furthermore, the first detachable part 51 enables the sensor substrate 41d to be easily replaced. For example, the sensor substrate 41d can be replaced with the one having a different arrangement of the magnetic field sensors 42 according to change in the arrangement of the probes 20.

Embodiment 2

Embodiment 2 will exemplify a semiconductor evaluation apparatus 10 and a probe position inspection device 40 that can accurately detect positions of probes 20 even when an inspection magnetic field producing part 31 included in each of the probes 20 is a paramagnet or a ferromagnet that is never magnetized. The description of the same structure as that of Embodiment 1 will be omitted herein.

[Magnetic Field Sensors]

Figure 8:
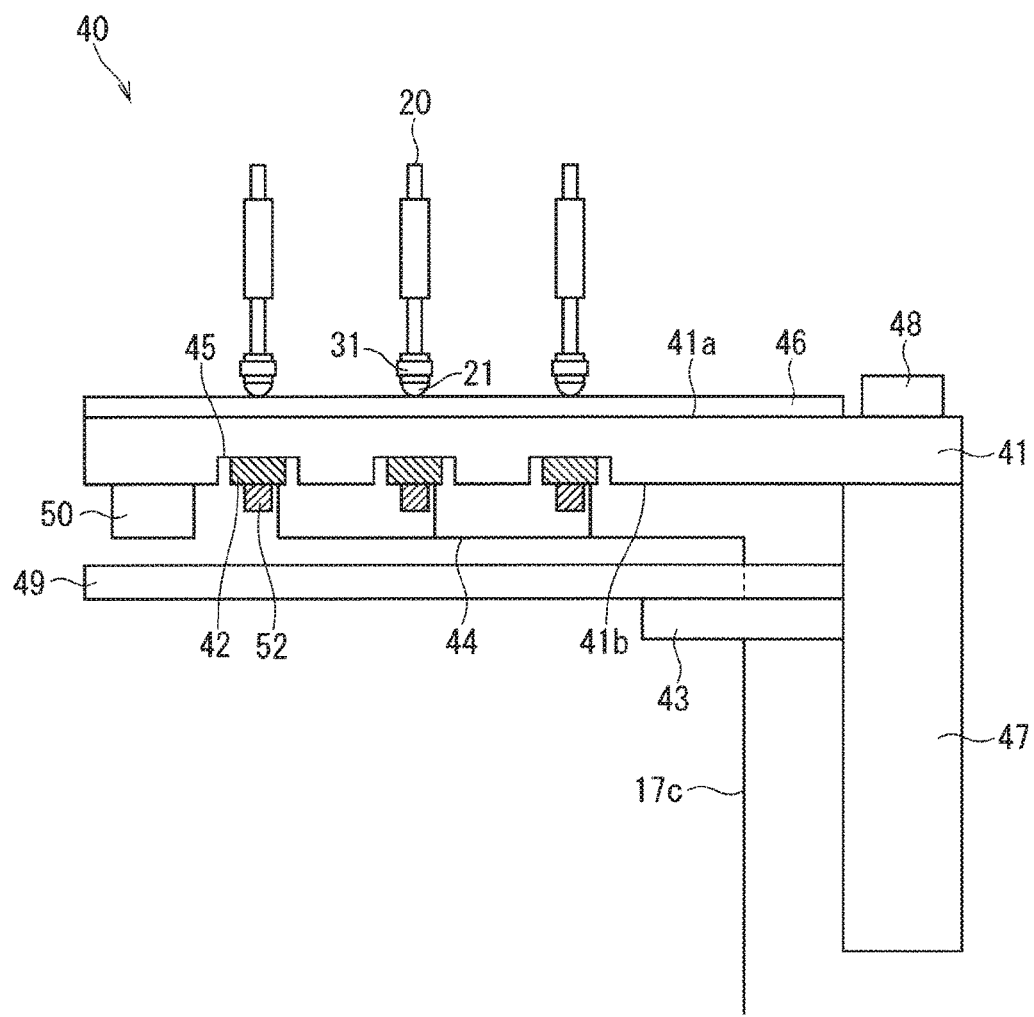
FIG. 8 schematically illustrates a structure of a probe position inspection device according to Embodiment 2.

FIG. 8 illustrates a structure of the probe position inspection device 40 according to Embodiment 2. In FIG. 8, the base part 41 is illustrated by its cross section. Magnetic field sensors 42 are placed in counterbored parts 45 provided in a back surface 41b of the base part 41 as according to Embodiment 1. Each of the magnetic field sensors 42 according to Embodiment 2 is a magnetic field sensor that senses, as a sensing direction, a magnetic field component in a direction different from an in-plan direction that is parallel to the front surface 41a of the base part 41, that is, in an off-plane direction. The magnetic field sensors 42 each sense magnetic flux in a direction between the contact part 21 of the probe 20 and the magnetic field sensor 42 with higher sensitivity. The magnetic field sensor 42 according to Embodiment 2 is preferably a linear output Hall IC. With the linear output Hall ICs, the probe position inspection device 40 can easily change a threshold for determining whether the probe is displaced, using an output signal processing circuit at a stage subsequent to the magnetic field sensors 42. Thus, when the magnetic field sensors 42 according to Embodiment 2 are linear output Hall ICs, the probe position inspection device 40 can adjust the threshold according to a magnetic flux density of external magnetic field applying parts 52 to be described later, or a type of the inspection magnetic field producing parts 31 included in the probes 20, using the output signal processing circuit at the subsequent stage such as an evaluator 16. In other words, the magnetic field sensors 42 are preferably linear output Hall ICs to improve the accuracy in detecting the positions of the probes 20.

[External Magnetic Field Applying Parts]

The base part 41 included in the probe position inspection device 40 further includes an external magnetic field applying part 52 that applies an external magnetic field to the inspection magnetic field producing part 31 included in the probe 20, the external magnetic field applying part 52 being placed at a position corresponding to each of the magnetic field sensors 42. Particularly in Embodiment 2, the external magnetic field applying parts 52 are placed at the same positions as the magnetic field sensors 42 in a planar view from a front surface side of the base part 41. Furthermore, the external magnetic field applying parts 52 are preferably placed outside of the base part 41 more than the magnetic field sensors 42. Specifically, the magnetic field sensors 42 and the external magnetic field applying parts 52 are placed at the bottom surface of the counterbored parts 45 in order at the positions at which the magnetic field sensors 42 are to be placed as illustrated in FIG. 8. Here, the external magnetic field applying parts 52 are preferably placed each in contact with a surface of the magnetic field sensor 42. According to Embodiment 2, the external magnetic field applying parts are in close contact with the surface. Furthermore, when the sensor substrate 41d including the magnetic field sensors 42 is used, the external magnetic field applying parts 52 are also placed in the sensor substrate 41d. The external magnetic field applying parts 52 are permanent magnets or electromagnets.

[Inspection Magnetic Field Producing Parts]

The probes 20 according to Embodiment 2 are the same as those according to Embodiment 1 except for the structure of the inspection magnetic field producing parts 31. As illustrated in FIG. 3A, the probe 20 includes the ring-shaped inspection magnetic field producing part 31 placed around the plunger part 24. The inspection magnetic field producing part 31 according to Embodiment 2 is a paramagnet or a ferromagnet to be magnetized by an external magnetic field applied by the external magnetic field applying part 52. Specifically, in contrast to the ferromagnet according to Embodiment 1, the inspection magnetic field producing part 31 according to Embodiment 2 may be a ferromagnet having no remanence, or a paramagnet or a ferromagnet to which no remanence can be applied even though it is to be magnetized by a magnetizer. The probability that a ferromagnet is to be magnetized depends on the concentration of impurities in materials included in the ferromagnet, such as carbon. Specifically, the concentration of impurities in materials included in the inspection magnetic field producing part 31 according to Embodiment 2 is lower than that according to Embodiment 1. The ferromagnet is mainly made of, for example, iron, cobalt, or nickel. Furthermore, the paramagnet is made of, for example, aluminum or platinum.

[Operations of Probe Position Inspection Device and Semiconductor Evaluation Apparatus]

The operations of the semiconductor evaluation apparatus 10 including the probe position inspection device 40 according to Embodiment 2 will be described with reference to FIG. 8. The description of the same operations as those of Embodiment 1 will be omitted herein. At the 1st step, the probes 20 including paramagnets or ferromagnets as the inspection magnetic field producing parts 31 are prepared. At the 3rd step, when the probes 20 are brought closer to the front surface 41a of the base part 41, the inspection magnetic field producing parts 31 are magnetized by external magnetic fields applied by the external magnetic field applying parts 52. Specifically, the magnetic fields induced by the inspection magnetic field producing parts 31 are produced around the contact parts 21 of the probes 20. The magnetic flux of the magnetic fields is mainly directed in a direction between the inspection magnetic field producing parts 31 and the external magnetic field applying parts 52. At the 4th step, the magnetic field sensors 42 each sense the magnetic field based on the magnetic flux. Particularly, the magnetic field sensors 42 according to Embodiment 2 each sensing a magnetic field component in an off-plane direction as a sensing direction sense the magnetic flux, based on the magnetic fields produced by the inspection magnetic field producing parts 31 and the external magnetic field applying parts 52 with higher sensitivity. The processes after the 5th step are identical to those according to Embodiment 1.

When the external magnetic field applying parts 52 are permanent magnets, the permanent magnets do not require high magnetic force and thus may be, for example, inexpensive ferrite magnets. This is because the probe position inspection device 40 detects the positions of the probes 20 in a state where the probes 20 are in proximity to the external magnetic field applying parts 52 as described above. The permanent magnets preferably have the magnetic force sufficient to magnetize the inspection magnetic field producing parts 31 at least in the proximity state. Furthermore, when the external magnetic field applying parts 52 are electromagnets, the probe position inspection device 40 includes an electric line to be connected to the electromagnets. The electromagnets have an advantage of easily varying the magnetic flux density to be generated. Specifically, since the electromagnets can adjust the magnetic flux density of an external magnetic field to be applied, they can generate an appropriate magnetic flux density according to the arrangement or intervals of the probes 20. The electromagnets can, for example, reduce the magnetic flux when the probes 20 are densely arranged. As a result, the probe position inspection device 40 increases the accuracy of inspecting the positions of the probes 20 because it can avoid the interference with the magnetic fields produced by paramagnets or ferromagnets of the other probes.

Furthermore, although the ferromagnets included in the probes 20 according to Embodiment 2 have not yet been magnetized when attached to the probes 20 as described above, they may be unexpectedly magnetized by the external magnetic field applied by the external magnetic field applying parts 52 during inspection of the positions of the probes 20. Thus, when the effect of the magnetized ferromagnets or the magnetic field induced by the remanence may affect the evaluation on the electrical characteristics of the subject semiconductor apparatus 11 as according to Embodiment 1, the user may preferably detach the ferromagnets from the probes 20 before the subject semiconductor apparatus 11 is evaluated. As such when the magnetic fields to be produced by the inspection magnetic field producing parts 31 included in the probes 20 may affect the evaluation on the subject semiconductor apparatus 11, it is preferred to provide paramagnets for the probes 20 and then inspect the positions of the probes 20 and evaluate the subject semiconductor apparatus 11, or provide both paramagnets and ferromagnets for the probes 20 and at least detach the ferromagnets after inspecting the positions of the probes 20 and before evaluating the subject semiconductor apparatus 11. Provision of the ferromagnets is desirable to increase the sensitivity in inspecting the positions of the probes 20. This is because the ferromagnets can increase the magnitude of the magnetic fields to be produced around the inspection magnetic field producing parts 31 more than by the paramagnets, that is, can increase the magnetic flux sensed by the magnetic field sensors 42.

Furthermore, when the probe position inspection device 40 includes the magnetic shield 49 place at the back surface side or an outer region of the base part 41, the magnetic shield 49 preferably has a dimension sufficient to cover the magnetic field sensors 42, the line 44, and the external magnetic field applying parts 52.

[Advantages]

Each of the magnetic field sensors 42 included in the base part 41 of the probe position inspection device 40 according to Embodiment 2 is a magnetic field sensor that senses, as a sensing direction, a magnetic field component in a direction different from an in-plan direction that is parallel to the front surface 41a. With such a structure, the probe position inspection device 40 can accurately detect the positions of the probes 20, irrespective of variations in height of the ends of the probes 20.

The base part 41 included in the probe position inspection device 40 according to Embodiment 2 includes the external magnetic field applying part 52 that applies an external magnetic field to the inspection magnetic field producing part 31, the external magnetic field applying part 52 being placed at a position corresponding to each of the magnetic field sensors 42. Since the inspection magnetic field producing parts 31 are magnetized by the external magnetic fields applied by the external magnetic field applying parts 52 under such a structure, options of materials contained in the inspection magnetic field producing parts 31 will open up. Specifically, the probe position inspection device 40 can use, as the inspection magnetic field producing parts 31, ferromagnets having no remanence or ferromagnets to which no remanence can be applied even though they are to be magnetized by a magnetizer. Furthermore, the probe position inspection device 40 can use paramagnets as the inspection magnetic field producing parts 31.

The external magnetic field applying part 52 included in the base part 41 of the probe position inspection device 40 according to Embodiment 2 is placed at a position identical to a position of each of the magnetic field sensors 42 in a planar view from the front surface side of the base part 41. According to such a structure, the probe position inspection device 40 can accurately detect the positions of the probes 20 because of a positive correlation between the magnitudes of the magnetic fields sensed by the magnetic field sensors 42 and the positions of the probes 20.

The external magnetic field applying parts 52 included in the base part 41 of the probe position inspection device 40 according to Embodiment 2 are placed in contact with the magnetic field sensors 42. With such a structure, the probe position inspection device 40 can maximize the magnetic flux between the probes 20 and the external magnetic field applying parts 52 so that the magnetic field sensors 42 sense the magnetic flux. Accordingly, the probe position inspection device 40 can accurately detect the positions of the probes 20.

The external magnetic field applying parts 52 included in the base part 41 of the probe position inspection device 40 according to Embodiment 2 are permanent magnets or electromagnets. When the external magnetic field applying parts 52 are permanent magnets, they do not require any line unlike electromagnets, and are easily placed in the probe position inspection device 40 thus improving the maintenance of the external magnetic field applying parts 52. Furthermore, when the external magnetic field applying parts 52 are electromagnets, the magnetic flux density between the probes 20 and the external magnetic field applying parts 52 can be appropriately set according to the arrangement or intervals of the probes 20. For example, the probe position inspection device 40 can increase the accuracy of inspecting the positions of the probes 20 because it can avoid the interference between the magnetic fields produced by the adjacent probes 20.

The semiconductor evaluation apparatus 10 according to Embodiment 2 includes: the probe position inspection device 40; the stage 12 that supports the subject semiconductor apparatus 11; the probe 20; and the evaluator 16 that transmits and receives, through the probe 20, an electrical signal to and from the subject semiconductor apparatus 11 placed on the stage 12, and evaluates electrical characteristics of the subject semiconductor apparatus 11, wherein the inspection magnetic field producing part 31 included in the probe 12 is a ferromagnet or a paramagnet. With such a structure, the magnetic fields are produced around the probes 20 even when the inspection magnetic field producing parts 31 are paramagnets or ferromagnets that are never magnetized. With the magnetic field sensors 42 sensing the magnetic fields, the probe position inspection device 40 can accurately detect the positions of the probes 20.

Embodiments of the present invention can be free combined, and appropriately modified and omitted within its scope.

What is claimed is:

1. A probe position inspection device that inspects a position of a probe included in a semiconductor evaluation apparatus, said probe including an inspection magnetic field producing part that produces a magnetic field corresponding to a contact point with a subject semiconductor apparatus, said probe position inspection device comprising:
    a base part having a front surface contactable by said probe, and including a plurality of magnetic field sensors placed in a plane parallel to said front surface, each of said magnetic field sensors sensing said magnetic field produced by said inspection magnetic field producing part; and
    an output part electrically connected to said magnetic field sensors, said output part outputting, based on said magnetic field, a signal corresponding to each of said magnetic field sensors.

2. The probe position inspection device according to claim 1,
    wherein said magnetic field sensors are static magnetic field sensors each of which senses a static magnetic field in which said magnetic field is static.

3. The probe position inspection device according to claim 2,
    wherein said magnetic field sensors are linear output Hall ICs or binary output Hall ICs.

4. The probe position inspection device according to claim 1,
    wherein said magnetic field sensors are magnetic field sensors each of which senses, as a sensing direction, a magnetic field component in a direction different from a direction parallel to said plane.

5. The probe position inspection device according to claim 1,
    wherein said base part has a back surface opposite to said front surface, and
    said magnetic field sensors are placed at the back surface.

6. The probe position inspection device according to claim 1,
    wherein said base part includes counterbored parts, and said magnetic field sensors are placed in said counterbored parts.

7. The probe position inspection device according to claim 1,
    wherein said base part includes:
    a main base;
    a sensor substrate including said magnetic field sensors; and
    a first detachable part that attaches and detaches said sensor substrate to and from said main base.

8. The probe position inspection device according to claim 1,
    wherein said base part includes a non-magnetic material.

9. The probe position inspection device according to claim 8,
    wherein said base part includes a stainless steel, a ceramic material, or an engineering plastic.

10. The probe position inspection device according to claim 1,
    wherein said base part includes a protective part that protects said front surface.

11. The probe position inspection device according to claim 1, further comprising
    a magnetic shield placed at a back surface side or around a periphery of said base part.

12. The probe position inspection device according to claim 1, further comprising
    a temperature sensing part that measures an ambient temperature of said magnetic field sensors.

13. The probe position inspection device according to claim 1,
    wherein said base part includes an external magnetic field applying part that applies an external magnetic field to said inspection magnetic field producing part, said external magnetic field applying part being placed at a position corresponding to each of said magnetic field sensors.

14. The probe position inspection device according to claim 13,
    wherein said external magnetic field applying part is placed at a position identical to a position of each of said magnetic field sensors in a planar view from a front surface side of said base part.

15. The probe position inspection device according to claim 14,
    wherein said external magnetic field applying parts are placed in contact with said magnetic field sensors.

16. The probe position inspection device according to claim 13,
    wherein said external magnetic field applying parts are permanent magnets or electromagnets.

17. A semiconductor evaluation apparatus, comprising:
    said probe position inspection device according to claim 13;
    a stage that supports said subject semiconductor apparatus;
    said probe; and
    an evaluator that transmits and receives, through said probe, an electrical signal to and from said subject semiconductor apparatus placed on said stage, and evaluates electrical characteristics of said subject semiconductor apparatus,
    wherein said inspection magnetic field producing part included in said probe is a ferromagnet or a paramagnet.

18. The semiconductor evaluation apparatus according to claim 17, further comprising:
- a holder that supports said base part with connection; and
- a second detachable part that detachably connects said base part to said holder.

19. The semiconductor evaluation apparatus according to claim 17,
- wherein said inspection magnetic field producing part has a structure detachable from said probe.

20. The semiconductor evaluation apparatus according to claim 17, further comprising
- a third detachable part that detachably connects said probe to said semiconductor evaluation apparatus, said third detachable part being said inspection magnetic field producing part.

21. A method for inspecting a position of a probe using said semiconductor evaluation apparatus according to claim 17, said method comprising:
- bringing said probe in contact with said front surface of said base part;
- sensing said magnetic field produced by said inspection magnetic field producing part included in said probe, said sensing being performed by each of said magnetic field sensors included in said base part; and
- outputting an output signal based on said magnetic field sensed in said sensing, said outputting being performed by said output part.

22. The method according to claim 21, further comprising
- analyzing said output signal obtained in said outputting, and calculating a contact point at which said probe is in contact with said front surface of said base part, said analyzing and said calculating being performed by said evaluator.

23. A semiconductor evaluation apparatus, comprising:
- said probe position inspection device according to claim 1;
- a stage that supports said subject semiconductor apparatus;
- said probe; and
- an evaluator that transmits and receives, through said probe, an electrical signal to and from said subject semiconductor apparatus placed on said stage, and evaluates electrical characteristics of said subject semiconductor apparatus.

24. The semiconductor evaluation apparatus according to claim 23,
- wherein said inspection magnetic field producing part included in said probe is a ferromagnet.

25. The semiconductor evaluation apparatus according to claim 24, further comprising
- a magnetizer that magnetizes said ferromagnet with application of a ring current around said ferromagnet.

26. The semiconductor evaluation apparatus according to claim 23, further comprising:
- a holder that supports said base part with connection; and
- a second detachable part that detachably connects said base part to said holder.

27. The semiconductor evaluation apparatus according to claim 23,
- wherein said inspection magnetic field producing part has a structure detachable from said probe.

28. The semiconductor evaluation apparatus according to claim 23, further comprising
- a third detachable part that detachably connects said probe to said semiconductor evaluation apparatus, said third detachable part being the inspection magnetic field producing part.

29. A method for inspecting a position of a probe using said semiconductor evaluation apparatus according to claim 23, said method comprising:
- bringing said probe in contact with said front surface of said base part;
- sensing said magnetic field produced by said inspection magnetic field producing part included in said probe, said sensing being performed by each of said magnetic field sensors included in said base part; and
- outputting an output signal based on said magnetic field sensed in said sensing, said outputting being performed by said output part.

30. The method according to claim 29, further comprising
- analyzing said output signal obtained in said outputting, and calculating a contact point at which said probe is in contact with said front surface of said base part, said analyzing and said calculating being performed by said evaluator.

* * * * *